United States Patent

[11] 3,614,553

[72] Inventors David Louis Franklin;
Barry Joel Fehder, both of Somerset, N.J.

[21] Appl. No. 73,027
[22] Filed Sept. 17, 1970
[45] Patented Oct. 19, 1971
[73] Assignee RCA Corporation

[54] POWER TRANSISTORS HAVING CONTROLLED EMITTER IMPURITY CONCENTRATIONS
3 Claims, 2 Drawing Figs.

[52] U.S. Cl. 317/235, 29/576
[51] Int. Cl. H01l 11/14
[50] Field of Search 317/234, 235

[56] References Cited

UNITED STATES PATENTS

| | | | |
|---|---|---|---|
| 3,192,082 | 6/1965 | Tomono et al. | 148/172 |
| 3,338,758 | 8/1967 | Tremere | 148/335 |
| 3,458,367 | 7/1969 | Yasufuku | 148/175 |
| 3,487,301 | 12/1969 | Gardner et al. | 317/234 X |
| 3,500,143 | 3/1970 | Lamming | 317/235 |

*Primary Examiner*—James D. Kallam
*Attorneys*—Glenn H. Bruestle

ABSTRACT: A power transistor having emitter, base, and collector regions, with the impurity concentration in the emitter region controlled so that the sheet resistance of that region adjacent the emitter-base junction is approximately equal to the sheet resistance of the base region underneath the emitter region, divided by the maximum beta of the transistor.

PATENTED OCT 19 1971 3,614,553

INVENTORS
Barry J. Fehder &
David L. Franklin
Herbert L. Allen
ATTORNEY

POWER TRANSISTORS HAVING CONTROLLED EMITTER IMPURITY CONCENTRATIONS

BACKGROUND OF THE INVENTION

The present invention relates to semiconductor devices, and in particular, relates to power transistors.

Transistors designed to handle relatively high power have been limited in their operating characteristics by an undesirable phenomenon known as second breakdown. Second breakdown is a device condition in which the emitter current concentrates in local regions of the emitter and locally overheats the transistor, often causing serious impairment or complete destruction of the device. For a detailed discussion of second breakdown, see W. Shockley, U.S. Pat. No. 3,286,138.

An improvement in second breakdown characteristics has been achieved by utilizing ballasting resistance means associated with discrete portions of the emitter, in order to limit the maximum current that can flow between the emitter contact and the emitter-base junction. For example, see Cohen, U.S. Pat. No. 3,448,354. However prior art ballasting techniques are relatively sophisticated, and are not feasible for all types of transistor design. Other techniques are therefore required to impart good second breakdown characteristics.

SUMMARY OF THE INVENTION

The present invention comprises a transistor formed in a semiconductor body having a major surface. The transistor includes a first conductivity type collector region in the body and a second conductivity type base region adjacent the collector region; the base region extends to the surface of the body.

A first conductivity type emitter region extends into the base region from the surface, and forms an emitter-type base junction with the base region. That portion of the base region between the emitter and collector regions has a given sheet resistance, and that portion of the emitter region adjacent the emitter-base junction has a sheet resistance approximately equal to this base region sheet resistance, divided by the maximum beta of the transistor.

THis invention also includes a method for making the transistor. The method includes the steps of selecting the maximum beta for the transistor, calculating the base region of sheet resistance underneath the emitter region as it will be after the emitter region is formed, dividing the base region sheet resistance by the selected beta, and forming an emitter region having a sheet resistance adjacent the emitter-base junction which is approximately equal to the result of the division step.

THE DRAWING

DETAILED DESCRIPTION

Figure 1:
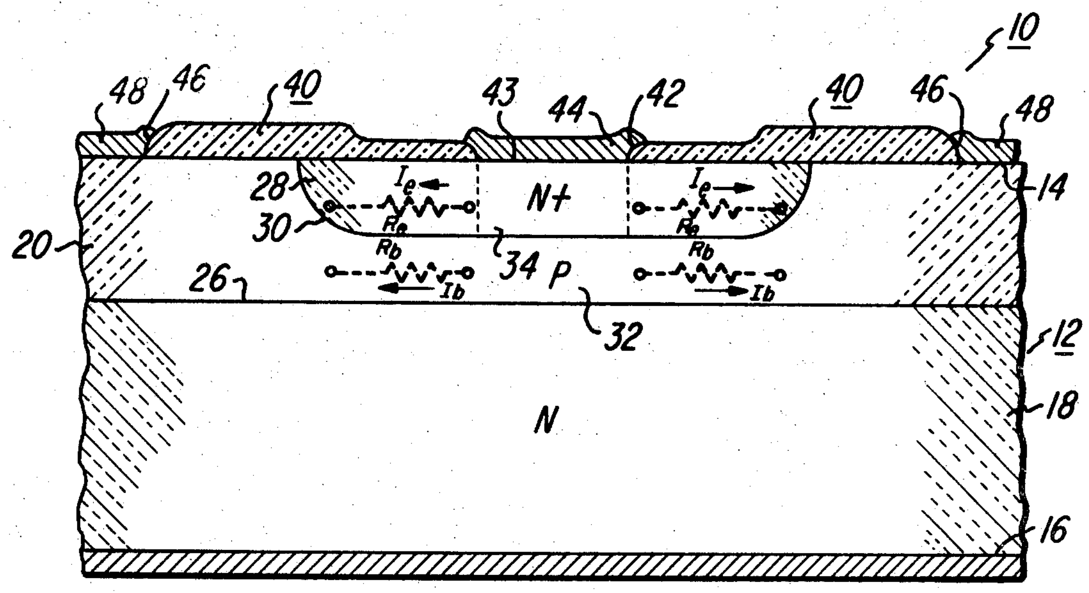
FIG. 1 is a cross section of a transistor in accordance with the present invention.

A power transistor in accordance with the present invention will be described with reference to the drawing. The transistor, referred to generally as 10, is formed in a semiconductor body 12 having upper and lower surfaces 14 and 16, respectively. PReferably, the semiconductor body 12 is silicon. The dimensions of the body 12 are not critical. The transistor 10 may be a NPN or a PNP device, however, a NPN device is shown in the drawing, and described with reference thereto.

Formed within the semiconductor body 12 is an N-type collector region 18. The parameters and dimensions of the collector region 18 are not critical and are determined by transistor design criteria well known in the art.

The transistor 10 also includes a P-type base region 20 adjacent the N-type collector region 18, with a base-collector PN junction 26 therebetween. A portion of the base region 20 extends to the upper surface 14. An N-type emitter region 28 extends into the base region 20 from the upper surface 14, with an emitter-base PN junction 30 therebetween. An insulating coating 40, e.g. silicon dioxide, is disposed on the upper surface 14. The coating 40 has an emitter aperture 42 which exposes an inner area 43 of the emitter region 28 at the upper surface 14. A conductive emitter contact layer 44 is disposed through the emitter aperture 42 and makes contact only to the central area 43 of the emitter region 28 at the upper surface 14. In a like manner, the coating 40 has base apertures 46 through which a base contact layer 48 is disposed.

The parameters of the base region 20 are also determined by well-known design criteria; and, once the emitter region 28 is formed in the base region 20, that portion 32 of the base region which is between the collector region 18 and the emitter region 28 has a given sheet resistance which may be calculated prior to formation of the emitter region 28, as described in the examples set out below. Generally, this base region sheet resistance ($\rho_b$) in that base region portion 32 after formation of the emitter region 28 is between 1,000–4,000 ohms/square for PNP devices, and 3,000–8,000 ohms/square for NPN devices. In accordance with this invention, that portion 34 of the emitter region 28 which is adjacent the emitter-base junction 30 has a sheet resistance ($\rho_e$) which is approximately equal to the sheet resistance of the base region portion 32, divided by the maximum beta ($\beta$) of the transistor 10. That is, the sheet resistance of the emitter region portion 34 is given by the expression:

$$\rho_e = \rho_b / \beta$$

Figure 2:
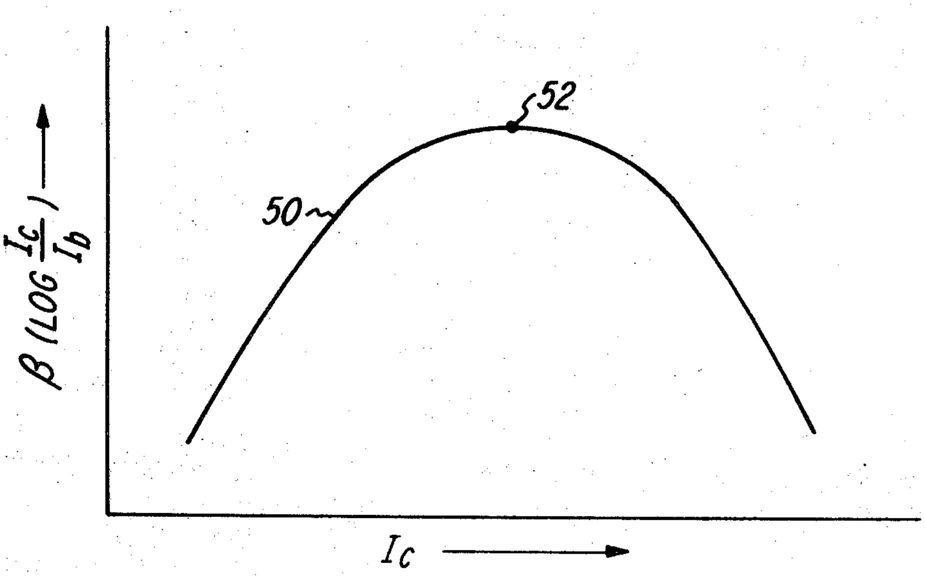
FIG. 2 is a typical plot of beta versus collector current of a transistor like that of FIG. 1.

The term "approximately" is intended to mean that the sheet resistance of the emitter region portion 34 is within 50 percent of the calculated value, determined from the above expression. However, an emitter sheet resistance within 25 percent of the calculated value is preferred. By way of example, if the calculated value of $\rho_e$ is 50.0 ohms/square, then it is preferred that the actual $\rho_e$ of the emitter region portion 34 be between 37.5 and 62.5 ohms/square. Beta is defined as the ratio of collector current $I_c$ to base current $I_b$ when the transistor 10 is operating with a forward-biased emitter-base junction 30. Maximum beta is defined as the highest beta obtainable in the transistor 10 in the collector current $I_c$ operating range. FIG. 2 illustrates a typical curve 50 of beta, plotted as log $(I_c)/I_b$, versus collector current $I_c$. Point 52 on the curve 50 represents the maximum beta, which may be selected during fabrication of the transistor, as described below.

The transistor 10 achieves a good second breakdown characteristic in the following manner. As shown schematically in the drawing, the emitter region portion 34 between the area under the emitter contact layer 44 and the periphery of the emitter-base junction 30 has an inherent voltage drop $I_eR_e$; that is, the voltage drop created by the emitter current $I_e$ flowing through the emitter region portion 34 to the emitter periphery. In a like manner, the base region portion 32 has an inherent voltage drop $I_bR_b$ caused by the base current $I_b$ flowing through the base region along a similar path adjacent the emitter-base junction 20. Voltage drops $I_eR_e$ and $I_bR_b$ are directly dependent on the sheet resistance in the emitter and base region, respectively, and are related to each other by the maximum beta of the transistor, as indicated in the relationship set out above. This relationship creates a more uniform biasing potential along the emitter-base junction 30; and, in turn, results in a more uniform emitter current injection along the junction which reduces current crowding. This reduction in current crowding prevents the local hot spots which lead to second breakdown, and further improves gain linearity.

Example I

The starting material was an N-type silicon wafer having a sheet resistance of 0.01 ohms/square and a thickness of 7.0 mils. This highly conductive wafer serves as an N+ collector substrate. A first layer of the N-type conductivity was deposited on the wafer by epitaxial deposition techniques well known in the art. This layer was 1.0 mils thick and had a sheet resistance of 15.0 ohms/square. Thereafter, a base region of P-type conductivity was diffused into the N-type collector layer. This base region layer was 0.2 mils thick. It was determined that the emitter region 28 should extend 0.08 mils into the base region 20 after diffusion. By calculation, it was then determined that the final base region portion between the collector and emitter regions would have a sheet resistance of about 3,000 ohms/square. Since the base region in this example is P-type, this calculation was based on the simultaneous solution of the following two equations:

(1)
$$\mu_p=\frac{447.3}{\left[\frac{1+|c|}{6.3\times10^{16}}\right]^{.76}}+47.7$$

(2)
$$\frac{1}{R_b}=\int_{X_e}^{X_c}(\mu_p\cdot|c|\cdot q)\,dx$$

where $\mu_p$ = the mobility of holes in the P-type silicon, $|c|$ = the absolute value of the concentration of P-type impurity atoms (atoms/c.c.), $g = 1.6\times10^{119}$ coulombs, $X_e, X_c$ = the above-described distances from the upper surface 14 to the emitter-base and base-collector junctions, respectively, and $R_b$ = the sheet resistance in the base region portion 32 as it will be after emitter diffusion.

The manner in which $R_b$ is calculated prior to emitter diffusion is known. For example, equation (1) above is graphically illustrated at p. 68, and equation (2) is described at p. 217, of Philips, Transistor Engineering, McGraw-Hill, 1962.

Note that for a base region formed by epitaxial techniques, the calculation step simply requires a determination of the sheet resistance at any point, since the sheet resistance of an epitaxial layer is uniform.

This transistor was to be employed as a high-speed switching device. Therefore, a relatively low maximum beta of 80 was selected to insure a good current switching speed characteristic. The calculated base region sheet resistance of 3,000 ohms/square was divided by the maximum beta of 80, and a result of 47.5 ohms/square was obtained. An emitter region 28 was then diffused into the base region, 20 s0 that the sheet resistance in the emitter region portion 34 adjacent the emitter-base junction 30 was approximately 47.5 ohms/square. This was accomplished in the following manner. First, the oxide coating was treated with a standard photoresist-etch sequence to expose the upper surface 14 where the emitter was to be diffused. A thin layer of phosphorus doped glass was deposited on the surface using phosphorus oxychloride in a deposition furnace, by known techniques. The surface concentration of the phosphorous impurity is not critical, and may vary depending on the desired emitter depth, diffusion time and temperature. It was only necessary that the resulting emitter region have a sheet resistance of approximately 47.5 ohms/square adjacent the emitter-base junction. In this example, this was achieved by using a phosphorus deposited layer having an initial surface concentration of $7.5\times10^{18}$ atoms/cm$^3$. The wafer was thereafter placed in a diffusion furnace for 0.5 hours at 1,075° C. The resulting emitter region extended 0.08 mils into the base region and had the desired sheet resistance adjacent the emitter-base junction. Metallic contacts were deposited on the emitter, base and collector regions, the wafer was diced into individual pellets, and each pellet was bonded to the header of a device package. The operating characteristics of the controlled emitter transistors were then measured and compared with transistors having standard emitter concentrations of about $10^{20}$ atoms/cm$^3$, and a sheet resistance of 0.1 ohm/square adjacent the emitter-base junction. Both the controlled and uncontrolled devices were identical in structure and geometry, including the emitter pattern. It was found that the second breakdown and peak pulsed current capabilities of the controlled emitter transistors were improved by a factor or two over those transistors made with standard diffusion concentrations. In addition, the controlled emitter devices exhibited an increase in gain linearity over the uncontrolled devices. Further, the controlled emitter devices had storage times and fall times which averaged less than one-half that of the standard devices, thus yielding improved switching characteristics for those transistors having controlled emitter concentrations.

Example II

The starting material was a P-type silicon collector wafer having a sheet resistance of 0.1 ohms/square, and a thickness of 7.0 mils. A P-type collector layer 1.0 mil thick having a sheet resistance of 20 ohms/square was epitaxially deposited on the collector wafer. An N-type base region layer was then diffused into the collector layer. The base region had a thickness of 0.2 mils. The emitter region was to extend 0.1 mils into the base region after emitter diffusion. By calculation, it was determined that the base region portion would have a sheet resistance of 1,000 ohms/square between the emitter and collector after the emitter diffusion step. This calculation, for an N-type base region, is based on the simultaneous solution of the following two equations:

(1)
$$\mu_n=\frac{1265}{\left[\frac{1+|c|}{8.5\times10^{16}}\right]^{.72}}+65$$

(2)
$$\frac{1}{R_b}=\int_{X_e}^{X_c}(\mu_n\cdot|c|\cdot q)\,dx$$

where $\mu_n$ = the mobility of electrons in N-type silicon, $|c|$ = the absolute value of the concentration of N-type impurity atoms (atoms/c.c.), $q > 1.6\times10^{119}$ coulombs, $X_e, X_c$ = the above-described distances from the upper surface of the silicon wafer to the emitter-base and base-collector junctions, respectively, and $R_b$ = the sheet resistance in the base region portion as it will be after emitter diffusion.

A desired maximum beta of 100 was selected for the device. The base region sheet resistance of 1,000 ohms/square was divided by the beta of 100, and a result of 10 ohms/square was obtained.

The oxide coating was then treated with a standard photoresist-etch sequence to expose that portion of the upper surface of the base region where the emitter region was to be located. A boron impurity source having a surface concentration of $2\times10^{19}$ atoms/cm.$^3$ was deposited over the exposed area. The wafer was thereafter placed in a diffusion furnace and heated to 1,150° C. for 0.3 hours. The final emitter region had a depth of 0.1 mils and a sheet resistance of approximately 10 ohms/square adjacent the emitter-base junction. Metal contacts were deposited over the emitter, base, and collector regions, the wafer was diced into individual pellets, and each pellet was mounted onto a package header. The operating characteristics of the device made in this manner were measured and compared with identical transistors made without control of the emitter impurity concentration. The controlled emitter transistors were found to have improvements similar to those described in example I.

We claim:

1. A transistor comprising:

a. a semiconductor body having a major surface;

b. a first conductivity type collector region in said body;

c. a second conductivity type base region adjacent said collector region, said base region extending to said surface;

d. a first conductivity type emitter region extending into said base region from said surface forming an emitter-base PN junction therein;

e. said base region comprising a portion between said emitter and collector regions; and f. said emitter region comprising a portion adjacent said emitter-base PN junction having a sheet resistance approximately equal to the sheet resistance of said portion of the base region divided by the maximum beta of said transistor.

2. A transistor according to claim 1, further comprising a conductive layer disposed on the central area only of said emitter region at said second surface.

3. A transistor according to claim 2 wherein said base region sheet resistance is between 1,000 to 8,000 ohms/square.